United States Patent
Tryon et al.

(10) Patent No.: US 8,541,115 B2
(45) Date of Patent: Sep. 24, 2013

(54) OXIDE COATING FOUNDATION FOR PROMOTING TBC ADHERENCE

(75) Inventors: Brian S. Tryon, Glastonbury, CT (US); Joseph Parkos, East Haddam, CT (US)

(73) Assignee: United Technologies Corporation, Hartford, CT (US)

(*) Notice: Subject to any disclaimer, the term of this patent is extended or adjusted under 35 U.S.C. 154(b) by 507 days.

(21) Appl. No.: 12/362,776

(22) Filed: Jan. 30, 2009

(65) Prior Publication Data
US 2010/0196728 A1    Aug. 5, 2010

(51) Int. Cl.
*B32B 15/04*    (2006.01)

(52) U.S. Cl.
USPC .......................... 428/701; 428/702

(58) Field of Classification Search
USPC .................. 428/428, 432, 701, 702
See application file for complete search history.

(56) References Cited

U.S. PATENT DOCUMENTS

| | | | |
|---|---|---|---|
| 4,916,022 A * | 4/1990 | Solfest et al. | 428/623 |
| 4,935,073 A * | 6/1990 | Bartlett et al. | 148/247 |
| 5,534,338 A * | 7/1996 | Saito et al. | 442/230 |
| 5,780,106 A * | 7/1998 | Conner | 427/250 |
| 5,843,843 A * | 12/1998 | Lee et al. | 438/688 |
| 5,891,267 A * | 4/1999 | Schaeffer et al. | 148/206 |
| 6,258,467 B1 * | 7/2001 | Subramanian | 428/633 |
| 6,521,294 B2 * | 2/2003 | Rigney et al. | 427/253 |
| 6,843,861 B2 * | 1/2005 | Grossman et al. | 148/280 |
| 6,926,971 B2 * | 8/2005 | Groll | 428/651 |
| 7,326,470 B2 | 2/2008 | Ulion et al. | |
| 2001/0053413 A1 * | 12/2001 | Rigney et al. | 427/253 |
| 2002/0172808 A1 * | 11/2002 | Wustman et al. | 428/195 |
| 2003/0118863 A1 * | 6/2003 | Darolia et al. | 428/650 |
| 2005/0058547 A1 * | 3/2005 | Bruce et al. | 416/241 R |
| 2005/0244663 A1 * | 11/2005 | Ulion et al. | 428/472 |
| 2007/0224411 A1 * | 9/2007 | Hazel et al. | 428/334 |

FOREIGN PATENT DOCUMENTS

JP    2005-336524    * 12/2005

OTHER PUBLICATIONS

JP 2005-336524 Wada English machine translation.*
Schmitt-Thomas, KH.G et al.; "Thermal Barrier Coatings with Improved Oxidation Resistance"; Surface and Coatings Technology, Elsevier, Amsterdam, NL; vol. 68/69, Jan. 1, 1994; pp. 113-115; XP000991301; ISSN: 0257-8972; paragraph 3.

* cited by examiner

*Primary Examiner* — David Sample
*Assistant Examiner* — Lauren Colgan
(74) *Attorney, Agent, or Firm* — Bachman & LaPointe, P.C.

(57) ABSTRACT

A coating system for a turbine engine component has a substrate, a masking layer on a surface of the substrate, which masking layer comprises a homogeneous layer of a single metal, a non-thermally grown oxide layer deposited on the masking layer, and a thermal barrier coating deposited on the oxide layer.

5 Claims, 1 Drawing Sheet

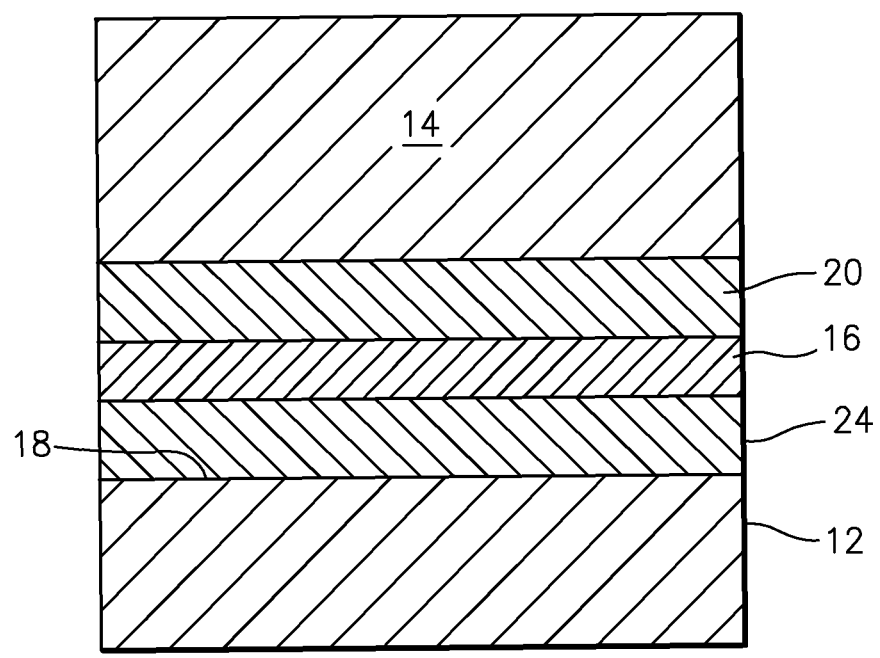

OXIDE COATING FOUNDATION FOR PROMOTING TBC ADHERENCE

BACKGROUND

This disclosure relates to the formation of an oxide coating foundation for promoting the adherence of a thermal barrier coating (TBC) to a substrate.

The high temperature exposure of nickel-based superalloys in turbine engines continues to increase. It is important that the nickel-based superalloy substrates be protected by thermal barrier coatings which enable their use in high temperature environments. Thermal barrier coatings provide a means to shelter the structural element, i.e. the turbine blade or vane, from the highest temperatures in the engine. However, oxidation of the metal surface of the substrate takes place as the thermal barrier coating is oxygen transparent. Metallic bond coats are added to the metallic surface of the substrate to form a reaction product of thermally grown oxide (TGO) of alumina between the bond coat and the thermal barrier coating topcoat. Formation of a sufficiently thick, adherent, and pure TGO scale is critical to both the oxidation protection of the superalloy and to achieve the adherence of the thermal barrier coating topcoat to the component.

SUMMARY

Accordingly, there is provided herein a process for forming a thermal barrier coating on a substrate, such as a turbine engine component, which has an oxide coating to promote adherence of the thermal barrier coating. The process broadly comprises the steps of providing a substrate, depositing a masking layer on a surface of the substrate, depositing a non-thermally grown oxide layer on the masking layer, and depositing a thermal barrier coating on said oxide layer.

Further, there is provided a coating system for a turbine engine component, which coating system comprises a substrate, a masking layer on a surface of the substrate, a non-thermally grown oxide layer on the masking layer, and a thermal barrier coating on the oxide layer.

Other details of the oxide coating for promoting adherence of a thermal barrier coating, as well as other objects and advantages attendant thereto, are set forth in the following detailed description and the accompanying FIGURE in which like reference numerals depict like elements.

BRIEF DESCRIPTION OF THE DRAWINGS

The FIGURE illustrates a coating system in accordance with the description herein.

DETAILED DESCRIPTION OF THE PREFERRED EMBODIMENT(S)

The present disclosure is directed to a new and useful coating system, and to a process for forming same, which coating system has an oxide layer for promoting adherence of a thermal barrier coating to a substrate.

Turbine engine components, such as turbine blades, vanes, and combustor panels, are subjected to high temperatures. Thermal barrier coatings have been developed to allow use of the turbine engine components in such environments. When using a thermal barrier coating, it is important that the thermal barrier coating be well adhered to the substrate.

The aforementioned turbine engine components typically have a substrate 12 which is formed from nickel based superalloys. It has been found that the nickel in these superalloys can interfere with the adherence of the thermal barrier coating 14 to the substrate 12. To eliminate the interference of the nickel, a masking layer 16 is deposited onto a surface 18 of the substrate 12. The masking layer 16 may be formed from a homogeneous layer of a single metal such as a pure aluminum or aluminum alloy layer or a pure titanium or titanium alloy layer. The masking layer 16 is formed so as to completely cover the surface 18 and so as to have no porosity. The masking layer may have a thickness in the range of from 0.1 to 10 mils, preferably from 0.1 to 0.25 mils.

The masking layer 16 may be deposited using any suitable technique known in the art including, but not limited to, a cathodic arc method, magnetron sputtering, low pressure plasma spraying (LPPS), electron beam plasma vapor deposition plating, or any other physical deposition process. In one useful technique, the masking layer may be deposited by cathodic arc deposition.

During the cathodic arc deposition process, an electrical current (e.g., about 300 amperes to about 400 amperes) is relayed from a cathode of the system to the coating source material which is desirable as a maskant. This induces an electrical arc that continuously contacts the surfaces of cathode ingot, thereby ionizing the metallic atoms at the points of contact. The metallic ions that are formed are blasted away from cathode ingot, toward a substrate. A negative bias (e.g., ranging from about −10 volts to about −100 volts) is desirably applied to substrate to accelerate the attraction of the metallic ions to substrate. The metallic ions then deposit on and bond to surface of substrate to form the masking layer 16.

After the masking layer 16 has been deposited, an oxide layer 20 is deposited thereon. The oxide layer 20 is a non-thermally grown oxide layer. The oxide layer 20 may be a layer of alumina. Alternatively, the oxide layer 20 may be a layer of titania. The oxide layer 20 may have a thickness in the range of from 0.001 to 4 mils, preferably from 0.004 to 0.010 mils. The oxide layer 20 provides the foundation for the component's oxide protection as well as the foundation for the thermal barrier coating topcoat. It is the presence of this oxide layer 20 which improves the adherence of the thermal barrier coating 14 to the substrate 12.

The oxide layer 20 may be deposited using any suitable technique known in the art including, but not limited to, a sputtering or any other suitable physical deposition process. In one useful technique, the oxide layer 20 may be electro deposited using a bath. After the oxide layer 20 has been deposited, the thermal barrier coating 14 is deposited thereon. The thermal barrier coating 14 may comprise any suitable thermal barrier coating known in the art.

If desired, an optional bondcoat layer 24 may be deposited on the surface 18 prior to the deposition of the masking layer 16. The bondcoat layer 24 may be formed from a MCrAlY material where M is selected from the group of Ni and/or Co, a platinum-aluminide material, or any other suitable aluminide material.

The masking layer 16 and the oxide layer 20 preserve more of the aluminum present in the substrate and/or the bondcoat. By depositing the oxide layer 20 before the thermal barrier coating, there will be a desirable thickness of oxide present and available to act as the foundation for the thermal barrier coating. This is not the case when the oxide layer is a thermally grown oxide layer. Currently, manufacturers rely on pre-heating in the thermal barrier coating in the presence of controlled oxygen pressures to generate an oxide scale layer. This sometimes produces transient oxides or oxides of variable thickness (including no oxide) which, at times, results in premature thermal barrier coating spallation known as infant mortality.

It is apparent that there has been provided by the instant disclosure an oxide coating foundation for promoting thermal barrier coating adherence which fully satisfies the objects, means, and advantages set forth hereinbefore. While the oxide coating foundation has been described in the context of specific embodiments thereof, there may be unforeseeable modifications, alternatives, and variations which become apparent to those skilled in the art having read the foregoing description. Accordingly, it is intended to embrace those modifications, alternatives, and variations, as fall within the broad scope of the appended claims.

What is claimed is:

1. A coating system for a turbine engine component, said coating system comprises a substrate, a masking layer on a surface of the substrate, said masking layer comprising a homogeneous layer of a single metal, a non-thermally grown oxide layer deposited on and in contact with the masking layer, said non-thermally grown oxide layer comprising one of alumina and titania, and a thermal barrier coating deposited on said oxide layer, wherein said masking layer comprises a layer of pure aluminum.

2. The coating system of claim 1, wherein said oxide layer comprises a layer of alumina.

3. The coating system of claim 1, wherein said oxide layer comprises a layer of titania.

4. The coating system of claim 1, wherein said substrate is one of a turbine blade and a vane.

5. The coating system of claim 1, wherein said substrate is a combustor panel.

* * * * *